US00RE40728E

(19) United States
(12) Reissued Patent
So et al.

(10) Patent Number: US RE40,728 E
(45) Date of Reissued Patent: Jun. 9, 2009

(54) ACID FUNCTIONAL POLYMERS BASED ON BENZOCYCLOBUTENE

(75) Inventors: Ying H. So, Midland, MI (US); Robert A. DeVries, Midland, MI (US); Mitchell G. Dibbs, Midland, MI (US); Robert L. McGee, Midland, MI (US); Edward O. Shaffer, II, Midland, MI (US); Michael J. Radler, Midland, MI (US); Richard P. DeCaire, Auburn, MI (US)

(73) Assignee: Dow Global Technologies Inc.

(21) Appl. No.: 10/808,270

(22) Filed: Mar. 24, 2004

Related U.S. Patent Documents

Reissue of:
(64) Patent No.: 6,361,926
Issued: Mar. 26, 2002
Appl. No.: 09/177,819
Filed: Oct. 23, 1998

(51) Int. Cl.
*G03F 7/038* (2006.01)
*G03F 7/039* (2006.01)
G03F 7/021; G03F 7/023

(52) U.S. Cl. ..... 430/287.1; 430/286.1; 430/176; 430/197; 430/192; 526/262; 526/281; 526/279; 526/284

(58) Field of Classification Search ..... 526/279, 526/284, 262, 281; 430/286.1, 287.1, 176, 430/197, 192
See application file for complete search history.

(56) References Cited

U.S. PATENT DOCUMENTS

| | | | | | |
|---|---|---|---|---|---|
| 4,540,763 | A | * | 9/1985 | Kirchhoff | 526/281 |
| 4,638,078 | A | * | 1/1987 | Kirchhoff | 558/414 |
| 4,724,260 | A | * | 2/1988 | Kirchhoff et al. | 546/112 |
| 4,783,514 | A | * | 11/1988 | Kirchhoff et al. | 526/281 |
| 4,812,588 | A | * | 3/1989 | Schrock | 556/453 |
| 4,826,997 | A | * | 5/1989 | Kirchhoff | 548/546 |
| 4,996,288 | A | * | 2/1991 | Bruza | 528/220 |
| 4,999,499 | A | * | 3/1991 | Bhatt | 250/342 |
| 5,034,485 | A | * | 7/1991 | Tong et al. | 526/232 |
| 5,136,069 | A | * | 8/1992 | DeVries et al. | 556/453 |
| 5,138,081 | A | * | 8/1992 | DeVries et al. | 556/466 |
| 5,185,391 | A | * | 2/1993 | Stokich, Jr. | 524/87 |
| 5,243,068 | A | * | 9/1993 | DeVries et al. | 560/205 |
| 5,277,536 | A | * | 1/1994 | Baldwin et al. | 414/409 |
| 5,349,111 | A | * | 9/1994 | Scheck | 568/721 |
| 5,391,650 | A | * | 2/1995 | Brennan et al. | 525/523 |
| 5,585,450 | A | * | 12/1996 | Oaks et al. | 526/279 |

FOREIGN PATENT DOCUMENTS

| | | | |
|---|---|---|---|
| EP | 0 527 572 | * | 2/1993 |
| JP | 04-136056 | * | 5/1992 |
| JP | 09-219586 | * | 8/1997 |
| WO | WO 94/25903 | * | 11/1994 |

OTHER PUBLICATIONS

Farona, Michael F., Prog. Polym. Sci., "Benzocyclobutenes in Polymer Chemistry," vol. 21, pp. 505–555 (1996).*
Hahn, et al., Macromolecules, Thermal Polymerization of Bis(benzocyclobutene) Monomers Containing .alpha., beta.–Disubstituted Ethenes, vol. 26, pp. 3870–3877, (1993).*
Ito, et al., Macromolecules, "Thermal and Acid–Catalyzed Deesterification and Rearrangement of Poly(2–cyclopropl–2–proply 4–vinylbenzoate) and Their Application to Lithographic Imaging," vol. 23, pp. 2589–2598, (1990).*
Kirchoff, et al., Prog. Polym. Sci., "Benzocyclobutenes in Polymer Synthesis," vol. 18, pp. 85–185, (1993).*
Kometani, et al., Macromolecules, "A Novel Approach to Inducing Aqueous Base Solubility in Substituted Styrene–Sulfone Polymers," vol. 26, pp. 2165–2170, (1993).*
Marks, et al. The Polymeric Materials Encyclopedia, Salamone, ed., "BCB Homopolymerization Chemistry and Applications," CRC Press, pp. 461–469, Jun. 1996.*
Moyers, et al., Negative Tone Photodefinable Benzocyclobutene Formulations For Thin Film Microelectronic Applications, Proceedings of 10.sup.th International Conference on Photopolymers, Oct.–Nov. 1994.*
Organic Chemistry, Morrison and Boyd, Allyn and Bacon, NY, 3.sup.rd Ed., pp. 675–681, 1975.*
Photoreactive Polymers: Wiley–Interscience Publication, pp. 102–127, 187 and 216, 1989.*
Photosensitive Polymides; Technomic Publishing Company, Inc., pp. 248–272, 1995.*
Skinner, et al., Dissolution Properties of Photobenzocyclobutene Films, Proceedings of the 10.sup.th International Conference on Photopolymers, Oct.–Nov. 1994.*
Wallraff, J. Vac. Sci. Tech., "Thermal and acid catalyzed deprotection kinetics in candiadate deep ultraviolet resist materials," B 12(6), pp. 3857–3862, (Nov./Dec. 1994).*
English Translation of Patent Application Kokai No H9–219586, Japanese Patent Office, 25 pages submitted by applicant in U.S. Appl. No. 09/177,819.*
English Translation of Patent Application Kokai No H4–136856, Japanese Patent Office, 19 pages submitted by applicant in U.S. Appl. No. 09/177,819.*

* cited by examiner

*Primary Examiner*—Cynthia Hamilton

(57) ABSTRACT

The invention is a curable cyclobutarene based polymer comprising acid functional pendant groups. The cured polymer displays excellent qualities of toughness, adhesion, dielectric constant, and low stress. The preferred system is soluble in an aqueous base and can be used to generate patterned films with excellent resolution without the need to handle organic developer solvents.

24 Claims, No Drawings

ACID FUNCTIONAL POLYMERS BASED ON BENZOCYCLOBUTENE

Matter enclosed in heavy brackets [ ] appears in the original patent but forms no part of this reissue specification; matter printed in italics indicates the additions made by reissue.

This invention was made with Government support under Agreement No. MDA972-3-0042 awarded by ARPA. The Government has certain rights in the invention.

FIELD OF THE INVENTION

This invention relates to polymers of benzocyclobutene monomers having acid functionality and their use in microelectronics applications.

BACKGROUND OF THE INVENTION

In certain applications in the microelectronics industry, such as interlayer insulators for integrated circuits, interposers, flat panel displays, and multichip modules, bumping redistribution, passivation/stress buffers, and thin film build-up layers on printed circuit boards, having a pattern of a dielectric material is useful or even necessary. Methods of forming this pattern include dry etching, wet etching, screen printing, ink jet printing, and use of dielectric materials which are themselves photoimageable.

In dry etching, a mask, composed of a material which is resistant to the etching process (frequently an $O_2$ plasma), is applied over the dielectric material. A plasma or laser is used to remove portions of the dielectric material which are not protected by the mask. The mask is then removed, leaving a patterned dielectric layer. See for example, Photosensitive Polyimides; Technomic Publishing Company, Inc.; 1995, pp. 254–55.

Similarly, a mask, typically a photoresist, is used in wet etching. The photoresist is applied over the dielectric material and image-wise exposed to activating radiation. The photoresist and the dielectric material are then removed in a corresponding image-wise manner during a developing step (typically with a aqueous base). The remaining photoresist material is subsequently removed, leaving an image-wise distribution of the dielectric material. For examples of this process see e.g. Photosensitive Polyimides; Technomic Publishing Company, Inc.; 1995, pp. 248–253. When the dielectric or dielectric precursor is itself photosensitive, some costs and complexities of the etching methods are avoided. Specifically, there is no need for a mask material and no need to coat, image, and remove the mask material. See for example, Photosensitive Polyimides; Technomic Publishing Company, Inc.; 1995, pp. 258–260. In negative photosensitive systems, the portion of the dielectric material or its precursor which is not exposed to activating radiation is removed during development. In positive systems, the portion of the dielectric material or its precursor which is exposed to activating radiation is removed during development. In other words, positive systems use a dark field mask rather than a light field mask. Positive systems generally have the additional benefit of being less susceptible to contamination than solvent developed negative systems.

Polymers of cyclobutarenes (also referred to herein as benzocyclobutenes) are known to be useful as insulating layers in electrical devices, protective films for semiconductor elements, as passivation films and as photoresists. Negative photosensitive cyclobutarene compositions, developable with a solvent have been developed. See for example, Cyclotene™ Series 4000 available from The Dow Chemical Company; Negative Tone Photodefinable Benzocyclobutene Formulations For Thin Film MicroElectronic Applications, Proceedings of $10^{th}$ International Conference on Photopolymers, October-November 1994; and WO 96/31805.

However, a cyclobutarene based composition developable in an aqueous base would be highly desirable. Such a composition would be highly useful in both photosensitive methods and wet etch methods for forming a patterned dielectric.

SUMMARY OF THE INVENTION

The Inventors have developed a cyclobutarene based polymer system having acid functionality. The materials, upon further cure, have excellent qualities of toughness, adhesion, dielectric constant, and low stress. The preferred system is soluble in an aqueous base and can be used to generate patterned films with excellent resolution without the need to handle organic developer solvents.

Thus, according to a first embodiment, the invention is a curable cyclobutarene based polymer comprising acid functional pendant groups. "Curable polymer" as used herein includes polymers that can be further cured or crosslinked as well as oligomers that can be further reacted to form higher molecular weight polymeric materials. Preferably, the acid functional groups are present at equivalent weights of about 200 to about *564, more preferably about 200 to about 434, more preferably still about 200 to about* 330 g/mole of acid functionality, more preferably about 220 to about 300 g/mole of acid functionality, and most preferably about 230 to about 270 g/mole of acid functionality. [For the preferred monomer (a) 1,3-bis(2-bicyclo[4.2.0]octa 1,3,5-trien-3-yl ethenyl)-1,1,3,3 tetramethylsiloxane (referred to herein as DVS-bisBCB) and BCB-acrylic acid as made in Example 1, an equivalent weight of less than about 290 g/mole of acid functionality provides solubility in alkaline aqueous solutions.] If the amount of acid groups is too low, the material will be insufficiently soluble in aqueous base. If the amount of acid groups becomes too high, water retention by the polymer may become a problem in certain uses or applications of the material.

Preferably, the polymer is the partially polymerized product of monomers comprising (a) a cyclobutarene monomer having the formula:

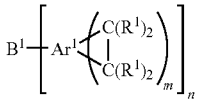

wherein $B^1$ is an n-valent organic linking group, preferably comprising ethylenic unsaturation, $Ar^1$ is a polyvalent aromatic or heteroaromatic group and the carbon atoms of the cyclobutane ring are bonded to ajacent carbon atoms on the same aromatic ring of $Ar^1$;

m is an integer of 1 or more;

n is an integer of 1 or more; and $R^1$ is a monovalent group;

and (b) a cyclobutarene monomer having a pendant group with acid functionality. Additional monomers, such as acrylate ester functional cyclobutarenes, may also be used. In fact, in effect, a terpolymer can be formed using certain acrylate ester functional cyclobutarene monomers (b'), such as a t-butyl acrylate ester, instead of the acid functional cyclobutarene. Under normal polymerization conditions the t-butyl groups are at least partially eliminated to generate carboxylic acid groups. Alternatively,, the acrylate ester functional cyclobutarenes can be at least partially hydrolyzed by conventional methods (Organic Chemistry, Morrison and Boyd, Allyn and Bacon, N.Y., 1975, 3rd Ed, pp. 675–681) to generate carboxylic acid groups.

According to a second embodiment the invention is a photosensitive composition comprising a curable cyclobutarene based polymer comprising acid functional pendant groups and a photoactive composition which functions as a dissolution inhibitor. Photosensitive as used in this application means that a latent, developable image or an immediately discernible image is formed if the material is exposed to activating wavelengths of radiation.

According to a third embodiment the invention is the use of a curable cycloubutarene based polymer comprising acid functional pendant groups in a wet etch process.

According to a fourth embodiment the invention is the use of a curable cyclobutarene based polymer comprising acid functional pendant groups as an aqueous developable, positive photoresist.

As used herein the term "group" means the structure as shown or recited with or without reasonable substitution so long as that substitution does not effect the function of the group. In contrast, the term "moiety" means the structure shown with no substitution.

DETAILED DESCRIPTION OF THE INVENTION

The cyclobutarene monomer (a) has the formula

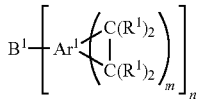

wherein $B^1$ is an n-valent organic linking group, preferably comprising ethylenic unsaturation, or $B^1$ is absent. Suitable single valent $B^1$ groups preferably have the formula —$CR^8$═$CR^9Z$, wherein $R^9$ and $R^9$ are independently selected from hydrogen, alkyl groups of 1 to 6, most preferably 1 to 3 carbon atoms, and aryl groups, and Z is selected from hydrogen, alkyl groups of 1 to 6 carbon atoms, aryl groups —$CO_2R^7$ wherein $R^7$ is an alkyl group, preferably of up to 6 carbon atoms, an aryl group, an aralkyl group, or an alkaryl group. Most preferably Z is —$CO_2R^7$ wherein $R^7$ is an alkyl group, preferably of up to 6 carbon atoms, an aryl group, an aralkyl group, or an alkaryl group. Suitable divalent $B^1$ groups include —$(CR^8{=}CR^9)_o$—$(Z')_{o-1}$, wherein $R^8$ and $R^9$ are as defined previously, o is 1 or 2, and Z' is an alkyl group of 1 to 6 carbon atoms, an aromatic group, or a siloxane group. Most preferably o is 2 and Z' is a siloxane group.

$Ar^1$ is a polyvalent aromatic or heteroaromatic group and the carbon atoms of the cyclobutane ring are bonded to adjacent carbon atoms on the same aromatic ring of $Ar^1$, preferably $Ar^1$ is a single aromatic ring;

m is an integer of 1 or more, preferably 1;

n is an integer of 1 or more, preferably 2–4, more preferably 2; and $R^1$ is a monovalent group, preferably hydrogen, lower alkyl of up to 6 carbon atoms.

The synthesis and properties of these cyclobutarenes, as well as terms used to describe them may be found, for example, in U.S. Pat. Nos. 4,540,763; 4,724,260; 4,783,514; 4,812,588; 4,826,997; 4,999,499; 5,136,069; 5,185,391; 5,243,068 all of which are incorporated herein by reference.

According to one preferred embodiment, the monomer (a) has the formula

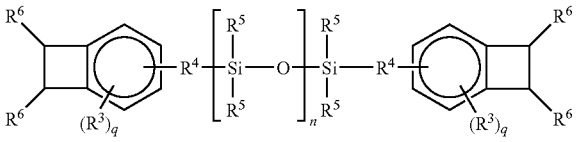

wherein each $R^3$ is independently an alkyl group of 1–6 carbon atoms, trimethylsilyl, methoxy or chloro; preferably $R^3$ is hydrogen;

each $R^4$ is independently a divalent, ethylenically unsaturated organic group, preferably an alkenyl of 1 to 6 carbons, most preferably —$CH_2$═$CH_2$—;

each $R^5$ is independently hydrogen, an alkyl group of 1 to 6 carbon atoms, cycloalkyl, aralkyl or phenyl; preferably $R^5$ is methyl;

each $R^6$ is independently hydrogen, alkyl of 1 to 6 carbon atoms, chloro or cyano, preferably hydrogen;

n is an integer of 1 or more;

and each q is an integer of 0 to 3.

The preferred organosiloxane bridged bisbenzocyclobutene monomers can be prepared by methods disclosed for example in U.S. Pat. Nos. 4,812,588; 5,136,069; 5,138,081 and WO 94/25903.

According to the most preferred embodiment, the monomer (b), has pendant group acid functionality, and preferably has the formula:

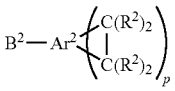

wherein $B^2$ is a monovalent organic group with acid functionality, preferably also containing ethylenic unsaturation;

$Ar^2$ is a polyvalent aromatic or heteroaromatic group and the carbon atoms of the cyclobutane ring are bonded to adjacent carbon atoms on the same aromatic ring of $Ar^2$, preferably $Ar^2$ is a single aromatic ring;

is an integer of 1 or more, preferably 1;

$R^2$ is a monovalent group, preferably hydrogen, lower alkyl of up to 6 carbon atoms.

Preferably, monomer (b) is selected from the following two formulas

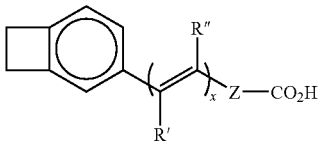

wherein

R' and R" are independently selected from hydrogen, alkyl groups of 1 to 6 carbon atoms, aryl groups, or R' and R" taken together from a cyclic group of 4 to 8 carbon atoms;

Z is a carbon to carbon bond or an aryl group;

x is an integer from 0 to 3, preferably 1; or

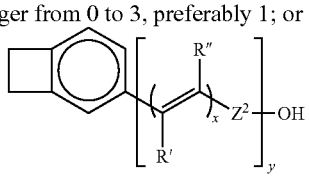

wherein

R' and R" are as defined above x is 1, y is 0 or 1, and $Z^2$ is an aryl group.

The monomer (b) may generally be synthesized by well known Heck chemistry—that is, a Palladium catalyzed coupling of a halogenated-cyclobutarene with a vinyl functional hydroxy containing compound. See for example, U.S. Pat. No. 5,243,068. However, if x=0, monomer (b) may be synthesized by a Grignard reaction reaction of a benzocyclobutene with carbon dioxide or by carbonylation of benzocyclobutene followed by hydrolysis. See U.S. Pat. No. 5,277,536. If y=0, monomer (b) may be synthesized by heating a halogenated cyclobutene with sodium hydroxide.

The preferred ethylenically unsaturated acid functional cyclobutarene may be synthesized by the following reaction as exemplified by reaction with acrylic acid.

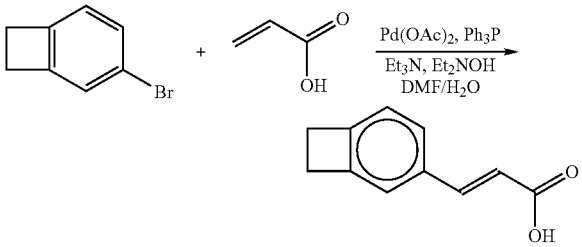

Alterantively, a monomer (b') may be used. Monomer (b') is characterized by the presence of a cyclobutarene group and a pendant functionality which at least partially reacts during polymerization of monomers (a) and (b') to form a pendant acid group. Preferably, monomer (b') has the formula:

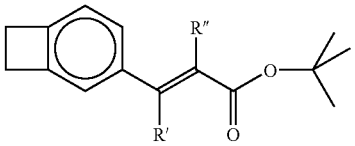

wherein Rϵ and R∀ R' and R" are as defined above and are preferably hydrogen. When (b') reacts with (a) the resulting polymer has both acrylate ester and acrylic acid functionalities. Monomer (b') can be prepared by a palladium-catalyzed arylation reaction of bromobenzocyclobutene.

Monomers (a) and (b) (or (a) and (b')) are partially polymerized, preferably in solvent but optionally neat, to form an oligomer or prepolymer that may then be used in aqueous base developed imaging system such as wet etch and photosensitive systems. Polymerization preferably occurs at a temperature in the range of about 125 to about 300° C., more preferably about 130 to about 200° C. The polymerization may occur for a time determined to provide a partially polymerized resin that provides the desired finally cured film properties. Preferably, the curable product has an apparent weight average molecular weight (Mw) as determined by Gas Permeation Chromatography (GPC) in the range of about 1000 to about 50,000 g/mol, preferably about 1500 to about 25,000 g/mol, and most preferably about 2000 to about 15,000 g/mol. If the molecular weight is too high, development in aqueous base may become difficult.

The molar ratio of monomer (a) to monomer (b) is preferably from about 20:80 to about 70:30, more preferably about 25:75 to about 50:50, and most preferably about 25:75 to about 40:60. Suitable solvents include those that dissolve the reacting monomers at the relevant processing temperature. Preferably, the solvent also dissolves the partially polymerized resin. Examples of such solvents include aromatic hydrocarbons such as toluene, xylene and mesitylene; $C_3$–$C_6$ alcohols; methylcyclohexanone; N-methylpyrrolidinone; butyrolactone; dipropylene glycol dimethyl ether isomers (commercially available from The Dow Chemical Company as Proglyde™ DMM). Dowanol™ DPMA ((di(propylene glycol) methyl ether acetate isomers available from The Dow Chemical Company) is preferred.

While not wishing to be bound by theory, the partially polymerized mateirals may be formed by a reaction mechanism such as the following examples for DVS-bisBCB and BCB-acrylic acid:

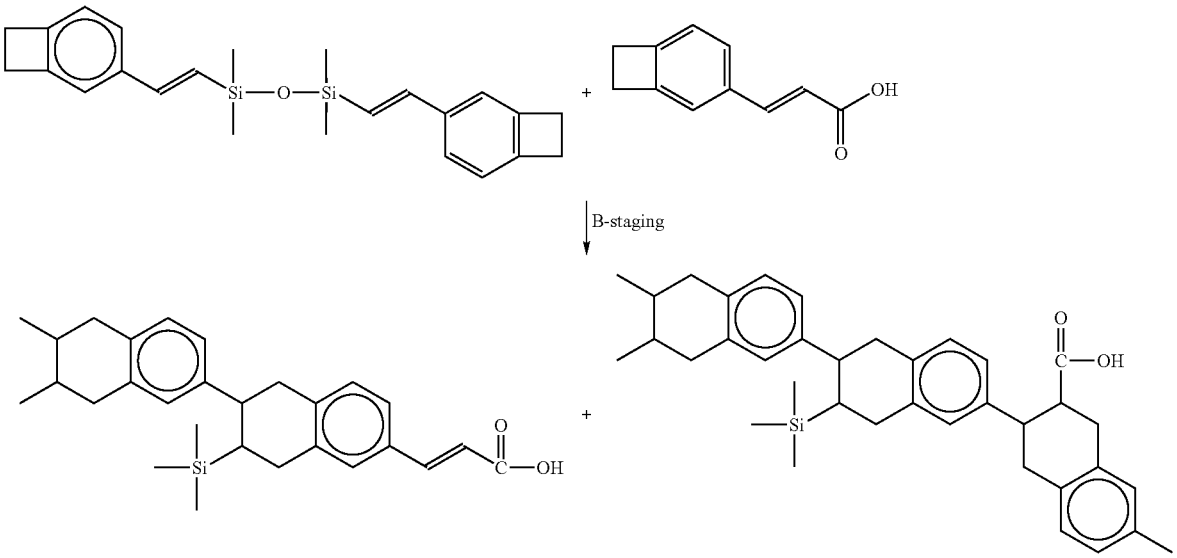

See also Kirchoff and Bruza, Progress in Polymer Science, 18, p. 85 and following. (1993); Farona, Benzocyclocutenes in Polymer Chemistry, Progress in Polymer Science, 21, p. 505 and following (1996); Marks et al., BCB Homopolymerization Chemistry and Applications, The Polymeric Materials Encyclopedia, Salamone, ed., CRC Press, June 1996; and Hahn et al., Thermal Polymerization of Bis (benzocyclobutene)Monomers containing alpha, beta-disubstituted Ethenes, Macromolecules, 26, 15, pp. 3870–3877, 1993.

Optionally, a photoactive composition may be added to the curable polymer to allow the curable polymer to form a photoreactive polymer composition that may be used in photosensitive imaging emthods. For negative systems, the photosensitive composition generally comprises a photoactive compound which is a photoinitiator that initiates further cure or cross-linking of the curable polymer. Examples of such compounds include peroxides, azo compounds and benzoin derivatives. See, for example, Photoreactive Polymers; Wiley-Interscience Publication; 1998, pp. 102–127. When exposed to activating radiation, the exposed portions of the composition become insoluble to the developer. Examples of the suitable developers include 1,3,5-triisopropylbenzene, decalin and Stoddard reagent. See for example, Dissolution Properties of Photobenzocyclobutene Films, Proceedings of the $10^{th}$ International Conference on Photopolymers, October-November, 1994.

Preferably, the photosensitive composition comprises a compound which serves as a dissolution inhibitor. This yields a positive photopolymer composition. When the photopolymer composition is exposed to activating radiation, the dissolution inhibitor ceases to function. When the developer solution is applied to the layer of the exposed photopolymer composition, those portions that were exposed to activating radiation are removed. The photosensitive composition may comprise a photoactive compound and a separate dissolution inhibitor or, preferably the dissolution inhibitor may itself be photoactive. Non-limiting examples of suitable photosensitive, dissolution inhibiting composition/compounds include sulfonyl esters of trihydroxybenzophenone (for example, THBP) and cumyl phenol. See Photoreactive Polymers; Wiley-Interscience Publication; 1989, p. 187. The developer solution is preferably an aqueous base solution. The preferred pH is in the range of 12 to 14. Examples of suitable developers include NaOH, LiOH, KOH, RbOH, CsOH, $Me_4NOH$, $Et_4NOH$. See for example, PHotoreactive Polymers, Wiley-Interscience Publication 1989, p. 216.

Thus, according to one embodiment, the invention is a process for providing an image of a dielectric material comprising the steps of:

a) providing a photosensitive polymer composition comprising
   (i) a curable cyclobutarene based polymer comprising acid functional pendant groups as described above and
   (ii) a photoactive composition, which prefrably comprises a dissolution inhibitor;
b) coating the photosensitive polymer composition onto a substrate;
c) image-wise exposing the coated composition to activating radiation to create a latent image;
d) developing the latent image with a developer, preferably an aqueous base solution.

The substrate preferably may be any substrate known to be useful in the microelectronics industry, such as, for example, silicon, glass, copper, aluminum ceramic, FR4 (glass reinforced epoxy), polyimide, bistriazine, and silicon nitride.

The polymers of this invention are also useful in a wet etch imaging process. That process comprises the steps of:

a) applying a coating of a curable cyclobutarene based polymer comprising acid functional pendant groups as described above to a substrate;
b) applying a mask over the coating,
c) removing portions of the coating not covered by the mask with a developer solution, preferably an aqueous base solution, and
d) removing the mask.

Preferably the mask is a photoresist. The mask is formed by coating the photoresist material onto the coating, exposing the coated photoresist material to activating radiation, and developing the mask and removing the cyclobutarene where portions of the mask are removed. Suitable photoresist materials include Microposit™ 1650 or Microposit™ 1827 (novolac diazoquinone resist from Shipley Co.) and Micropositive Resist 809 from Kodak. Suitable developers for those photoresist materials include the aqueous bases mentioned above.

The polymer of this invention may be coated by any known and including spin-coating, curtain-coating, roller-coating, spray-coating, dip-coating, extrusion coating, meniscus coating and electrodeposition.

EXAMPLES

Example 1

Preparation of 2-Propenoic acid, 3-bicyclo[4.2.0]octa-1,3,5 trien-3-yl (hereinafter referred to as BCB-acrylic acid)

Brominated benzocyclobutene (Br-BCB) was reacted with acrylic acid (AA) to form BCB-acrylic acid:

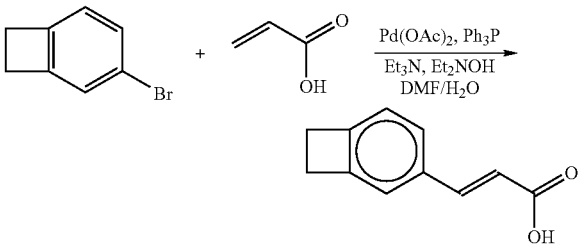

Specifically, a five0liter thermowell three-neck flask with a PTFE bottom drain was equipped with a PTFE stirrer bearing, an overhead electric agitator, a thermocouple-controlled heating mantle with a timer and a high-temperature shutoff, a nitrogen inlet atop a condenser leading to an oil bubbler, and a glass funnel. All joints were sealed with PTFE sleeves, and the flask was covered (above the mantle) with fiberglass insulation. The catalysts—1.01 grams of palladium acetate and 4.721 grams of triphenylphosphine—were weighed into a small nitrogen-flushed jar and magnetically stirred with about 100 grams of dimethylformamide (DMF) at room temperature (with the cap on). The flask was purged with nitrogen, charged with triethylamine, water, BrBCB, AA, and DMF (using some as a rinse, and saving some). The dissolved catalyst mix was added and rinsed in with some of the saved DMF.

The reactor was sparged at room temperature for not more than 20 minutes with nitrogen using the condenser as the outlet. The sparge tube was replaced with a glass stopper, the nitrogen inlet was returned to the condenser top, and the system was heated to 90° C. with rapid (600 rpm) stirring. The reaction was monitored by withdrawing ½-mL aliquots, partitioning the aliquot into water/HCl and methylene chloride (ensuring aqueous layer has pH<4), and analyzing the organic phase by capillary gas chromatography. The first sample was taken at 3 hours after addition. The reaction is done when BrBCB is essentially gone.

The temperature was lowered to 70° C. A solution of 252 grams of 50% caustic (3.15 moles) was diluted with DI water to about 1 kg. This was added to the reaction with stirring, (tot. mass 2672.3 grams), watching for an exotherm, and the reaction was washed with toluene at 70° C.

The warm aqueous phase was filtered through a 142-mm 0.22-microns MSI nylon membrane filter into a tared 4-L Erlenmeyer flask fitted with a mechanical agitator. Concentrated HCl (300 mL, about 3 moles) was diluted with water t 750 mL and was added dropwise with stirring until the pH of the solution was below about 3. The mixture allowed to cool to room temperature, and then refrigerated briefly. The crystals were collected by aspirator filtration. These were washed with cold DI water until the pH became natural. The crystals were dried on the aspirator, and further dried at 80° c. in a vacuum oven.

Example 2

Preparation and Positive Photoimaging of a Curable Polymer having a 25:75 Mole Ratio of DVS-bisBCB:BCB-acrylic Acid (about [228] *304* grams/mole of acid functionality)

a) MW of 3900 g/mole

DVS-bisBCB (26.81 g, 0.0687 mol) (as made, for example, in Procedure A of WO 94/25903), BCB acrylic acid (35.88 g, 0.206 mol) and 190 g Dowanol DPMA were added to a 3-necked flask equipped with a mechanical stirrer, a nitrogen inlet and a condenser. The mixture was heated under nitrogen at 160° C. for 50 hours.

The solution of DVS-bisBCB/BCB-AA oligomer (14.70 g, 29.2% solids, 4.292 g solids, Mw=3,900 g/mol) was mixed with 0.8462 g (16.5%) trihydroxybenzophenone naphthol sulfate ester (THBP). An adhesion promoter (hydrolyzed vinyl triacetate silane, referred to as VTAS) was applied to a wafer at 2000 rotations per minute (rpm). The solution was then spread on a 4 inch silicon wafer at 500 rpm (10 seconds) followed by spin-coating at 1500 rpm for 30 seconds. The wafer was baked on a hot plate at 95° C. for 4 minutes. The wafer was exposed with Karl Suss exposure tool with 2 micron gap between the mask and the film. Dose was 300 mJ/cm$^2$. After exposure, the wafer was placed in a 1.4% tetramethylammonium hydroxide (TMAH) bath for 1 minute and 58 seconds and patterns were developed. The wafer was rinsed with water and then flood exposed at 300 mJ/cm$^2$. The patterned wafer was baked at 120° C. for 1 hour to remove the residual solvent and then cured at 250° C. for 1 hour under nitrogen. Final film thickness was 4.7 micron.

b) MW of 6200 g/mole

A similar b-staging process to that in part a) was used to produce a prepolymer solution with a weight average molecular weight of 6,200 g/mole. No adhesion promoter was used. The solution was spread on a silicon wafer for 10 seconds at 500 rpm followed b spin coating for 30 seconds at 1500 rpms. The wafer was prebaked at 95° C. for 4 minutes and exposed through a mask with a Karl Suss exposure tool at 250 mJ/cm$^2$. The wafer was immersed in a dish containing 1.4% TMAH to develop for 60 seconds. Cure occurred under nitrogen purge at 250° C. for one hour. Final film thickness was 4 microns, with a resolution of 4 microns (4 micron vias were open) and a side wall angle of about 40–50 degrees.

c) MW of 8500 g/mole

DVS-bisBCB (48.8 g, 0.125 mole), BCB acrylic acid (65.3 g, 0.375 mole) and 343 g Downanol DPMA (45% solids) were heated under nitrogen with stirring until the weight average molecular weight of 8,500 g/mole was reached. Some solvent was removed to have solid contents of 30%. At this point, solution viscosity was 1,100 cP at 25° C. 24.7 grams of the solution was mixed with 1.46 grams THBP and the solution was filtered with a 5 micron syringe filter.

A patterned film on silicon wafers was generated as follows: An adhesion promoter (VTAS) was applied to a 4 inch diameter silicon wafer at 2000 rpm. The solution was spread at 500 rpm for 10 seconds followed by spin-coating at 1500 rpm for 30 seconds. The wafer was baked on a hot-plate at 95° C. for 4 minutes and exposed through a mask with a Karl Suss exposure tool at 250 mJ/cm$^2$. Proximity gap was 2 microns. The wafer was immersed in a dish containing 1.4% TMAH. Development time was 46 seconds. The wafer was allowed to dry, flood exposed at 250 mJ/cm$^2$, and cured in a nitrogen purged oven at 250° C. for 1 hour. Film thickness after cure was 5 microns. Five micron vias were all open and had side wall angles of about 55–60 degrees. A film spin-coated with the same speed but without going through exposure and development has thickness of 8.6 microns.

d) MW of 10,200 grams/mole

A similar b-staging process to that in part c) was used to produce a prepolymer solution with a weight average moleuclar weight of 10,200 g/mole. VTAS adhesion promoter was used as in part c). The prepolymer solution was spread on a silicon wafer for 10 seconds at 500 rpm followed by spin coating for 30 seconds at 1500 rpms. The wafer was prebaked at 95° C. for 4 minutes and exposed through a mask with a Karl Suss exposure tool at 250 mJ/cm$^2$. The wafer was immersed in a dish containing 1.4% TMAH to develop for 40 seconds. Cure occurred under nitrogen purge at 250° C. for one hour. Final film thickness was 4 microns, with a resolution of 4 microns (4 micron vias were open) and had a side wall angle of about 50–55 degrees.

Example 3

Preparation and Positive Photoimaging of a Curable Polymer having a 40:60 Mole Ratio of DVS-bisBCB:BCB-acrylic Acid (about [260] *433* g/mole of acid functionality)

a) MW of 4300 g/mole

DVS-bisBCB (48.8 g, 0.125 mole), BCB acrylic acid (32.6 g, 0.188 mole) and 100 g Dowanol DPMA were heated with stirring under nitrogen until weight average molecular weight of 4,300 g/mole was reached. Some solvent was added to have solid contents of 34%. At this point, solution viscosity was 1237 cP at 25° C.

A 27.2 g solution was mixed with 1.82 g THBP (16.5%) and the solution was filtered with a 5 micron syringe filter. A patterned film on the silicon wafers was generated as follows: An adhesion promoter was applied to a 4 inch diameter silicon wafer at 2000 rpm. The solution was spread at 500 rpm for 10 seconds followed by spin-coating at 1500 rpm for 30 seconds. The wafer was baked on a hot-plate at 95° C. for 4 minutes and exposed through a mask with a Karl Suss exposure tool at 250 mJ/cm$^2$. Proximity gap was 2 microns. The wafer was immersed in a dish containing 1.4% TMAH. Development time was 4 minutes 38 seconds. The wafer was allowed to dry, flood exposed at 250 mJ/cm$^2$, and cured in a nitrogen purged oven at 250° C. for 1 hour. Film thickness after cure was 8.4 micron. Ten micron vias were all open with a side wall angle of about 50–55 degrees. A film spin-coated with the same speed but without going through exposure and development has a thickness of 11 microns.

b) MW of 6800 g/mole

DVS-bisBCB (48.8 g, 0.125 mole), BCB acrylic acid (32.6 g, 0.188 mole) and 244 g Proglyde DMM were heated under nitrogen until weight average molecular weight of 6,800 g/mole was reached. Some solvent was removed to achieve solid contents of 32%. At this point, solution viscosity was 937 cP at 25° C.

A 25.9 g solution was mixed with 1.62 g THBP (16.5%) and the solution was filtered with 5 micron syringe filter. a patterned film on the silicon wafers were generated as follows: An adhesion promoter was applied to a 4 inch diameter silicon wafer at 2000 rpm. The solution was spread at 500 rpm for 10 seconds followed by spin-coating at 1500 rpm for 30 seconds. The wafer was baked on a hot-plate at 95° C. for 5 minutes and exposed through a mask with a Karl Suss exposure tool at 250 mJ/cm$^2$. Proximity gap was 2 microns. The wafer was immersed in a dish containing 1.4% TMAH. Development time was 77 seconds. The wafer was allowed to dry, flood exposed at 250 mJ/cm$^2$, and cured in a nitrogen pured oven at 250° C. for 1 h. Film thickness after cure was 5.9 microns. Five micron vias were all open with a side wall angle of about 50–55 degrees. A film spin-coated with the same speed but without going through exposure and development has thickness of 10 microns.

The same Example was repeated without flood exposure.

Example 4

Preparation of the Ethyl Ester of 2-Propenoic acid, 3-bicyclo [4.2.0]octa-1.3,5-trien-3-yl-, (hereinafter referred to as BCB-ethyl acrylate)

A 5-liter three-necked flask, equipped with a heating mantel, bottom dump valve, thermowell, reflux condenser, and stirrer assembly was charged with 1.43 g of palladium acetate, 7.78 g of tris-(o-tolyl)phosphine (TOTP), 356.8 g of 4-bromobenzocyclobutene, 195.5 g of ethyl acrylate, 385 g of potassium acetate, 585 mL of N,N-dimethylformamide (DMF), and 292 mL of deionized water. The reactor was degassed with a nitrogen sparge for 10 minutes and then heated to approximately 90–95° C. and held at this temperature. A sample of reactor product was analyzed after 20 hours by capillary GC and found to contain ~9 area % detectable 4-bromobenzocyclobutene and ~82.6% of the desired trans compound. After 22 hours the reactor was cooled and 1 liter of deionized water was added. The water layer was separated and discarded. the mixture was then diluted with 1 liter of toluene and the organic phase was washed with five 1-liter portions of deionized water. The organic phase was filtered through 150 mL of silica gel, topped with 40 g of magnesium sulfate, on a membrane filter assembly. GC analysis of this crude product showed 4.11 area % 4-bromobenzocyclotubene and 88.5% of the trans product, 1.8% of the gem product, and three heavier bisbenzocyclobutene adducts totaling about 2.2%.

The toluene was removed by rotary evaporator at 60° C. The product was vacuum distilled using a short-path molecular distillation system at 115° C. and 1–2 mm Hg to remove the residual bromobenzocyclobutene and heavier components to give approximately 185 g of trans product (87% of theory) with a purity greater than 97% of GC area %. This oily material formed white needles when cooled to room temperature. The solids were low melting and could be liquified using a heat gun.

Example 5

A Copolymer with a 5:4 Mole Ratio of BCB Ethyl Acrylate-:BCB Acrylic Acid

BCB ethylene acrylate (20.2 g, 0.1 mole), BCB acrylic acid (13.9 g, 0.08 mole) and dipropylene glycol methyl ether acetate (100 g) were heated at 160° C. for 96 hours. Mn=2, 200 and Mw=5,400. Some solvents was removed to generate a solution with 26.2% prepolymer. A film was spin-coated on a Si wafer at 1500 rpm and baked on a hot plate at 95° C. for 3 minutes. The wafer was placed in a 1.4% TMAH aqueous solution. The film dissolved in 35 seconds. Another Si wafer prepared with the same procedure was cured at 250° C. The film showed good resistance to N-methylpyrrolidinone (NMP), acetone and TMAH.

The solution was spin-coated on a NaCl wafer at 1500 rpm and cured. A free standing film was generated by dissolving the NaCl wafer in water. Dynamic mechanical spectroscopy showed transition at about 240° C. Modulus below transition was $2\times10^{10}$ dyn/cm$^2$. Initial stress of a 3.35 micron film on a 4 inch Si wafer at room temperature was about 30 MPa.

The solution (11.2 g, 2.93 g solids) was mixed with 589 mg THBP. An adhesion promoter was dynamically applied to a 4 inch wafer at 2000 rpm. Resin solution was spread at 500 rpm for 10 seconds and spin-caoted at 1800 rpm. The wafer prebaked on a hot plate at 95° C. for 4 minutes and exposed with a mask at 200 mJ/cm$^2$. Development was carried out in a 1.4% TMAH aqueous solution bath for 35 seconds to generate the pattern. The wafer was flood exposed at 200 mJ/cm$^2$ and then cured. A patterned film on the wafer was generated.

The same example was repeated without flood exposure.

Example 6

A Copolymer of DVS-bisBCB/BCB Ethyl Acrylate (10:90 mole ratio) *about 217 g/mole of acid functionality*

DVS-bisBCB (4.43 g, 0.0114 mole), BCB ethyl acrylate (20.6 g, 0.102 mole)and mesitylene (75 g) were heated at 165° C. for 108 hours. Some solvent was removed to generate a solution with 68% solids. A 3.1 micron film on 4 inch wafer had an initial stress of 28 MPa.

The copolymer solution may also be hydrolyzed to form a carboyxlic acid functionality by heating with caustic followed by neutrlization of the organic phase.

Example 7

A Terpolymer of 15 Mole Percent DVS-bisBCB, 15 Mole Percent BCB Eethyl Acrylate and 70 Mole Percent BCB Acrylic Acid DVS-bisBCB (9.59 g, 0.0246 mole), BCB ethyl acrylate (4.98 g, 0.0246 mole) and BCB acrylic acid (20 g, 0.115 mole) were heated in 105 g dipropyl glycol methyl ether acetate at 165° C. for 48 hours. The solution was cooled to room temperature. A film on the Si wafer was generated by spin-coating and curing at 250° C.

Example 8

Preparation of BCB-t-butyl Acrylate

A 5 liter three necked flask, equipped with a heating mantle, bottom dump valve, thermowell, reflux condenser and stirrer was charged with 1.43 grams of palladium acetate, 7.78 g of tris-(o-tolyl)-phosphine (TOTP), 356.8 g of 4-bromobenzocyclobutene (BrBCB), 250 grams of t-butyl acrylate, 385 g of potassium acetate, 585 mL of N,N-dimethylformamide (DMF) and 292 mL of deionized water. The reactor was degassed with a nitrogen sparge for 10 minutes and then heated to 93° C. After 19 hours a sample analyzed by capillary gas chromatography found no BrBCB and 91% trans-t-butyl acrylate BCB. After 22 hours the reactor was cooled and 1 liter of deionized water was added. The water layer was separated and discarded. The mixture was diluted with 1 liter of toluene and the organic phase washed with five 1-liter portions of deionized water. The organic phase was filtered through 150 mL of silica gel, topped with 40 g of magnesium sulfate on a membrane filter.

The toluene was removed by a rotary evaporator at aspirator vacuum using a 60° C. water bath, leaving 374.5 grams of crude product. The crude product was distilled at 120° C. and 0.005 torr. The overheads cut as 258.3 grams.

Example 9

Use of BCB-t-butyl Acrylate

BCB-t-butyl acrylate (34.5 grams), DVS-bisBCB (19.5 grams) and 162 grams of mesitylene were heated at 165° C. for over 66 hours. The solution was cooled to room temperature and filtered through a medium sintered glass filter. Part of the solution was spin-coated on a silicon wafer. The wafer was immersed in a TMAH solution. The spin-coated film started to break up in 10 seconds and dissolved in 50 seconds.

NMR spectra of DVS-bisBCB/t-butyl acrylate BCB prepolymers showed significant loss of the t-butyl group, ranging from 20% loss for a copolymer having 30 weight % t-butylacrylate BCB to 43% for a copolymer having 75 weight % t-butyl acrylate BCB. The presence of an acid group on the prepolymer was confirmed by IR spectroscopy. The IR spectra showed absorption of 1695 $cm^{-1}$ which is consistent with the presence of a carboxylic acid group.

Example 10

Use of DVS-bisBCB/BDB Acrylic Acid Copolymer in Wet Etching

DVS-bisBCB (17.60 grams, 0.0451 mol), BCB-acrylic acid (11.78 grams,0.0677 mol) and mesitylene (28 grams) were heated with stirring under nitrogen at 165° C. for 69 hours. The solution was spread on a 4 inch wafer at 500 rpm followed by spin-coating at 3500 rpm. The wafer was baked on a hot plate at 100° C. for 2 minutes. A photoresist, Microposit 1400 from Shipley Company, was spread on top of the BCB film at 500 rpm for 1 second and spin-coated at 3000 rpm for 30 seconds. the wafer was baked in an oven at 100° C. for 15 minutes followed by exposure at 150 $mJ/cm^2$. The wafer was placed in a 2.3% $Me_4NOH$ bath for 10 minutes to remove photroesist and BCB film in exposed areas. Water was used to rinse the etched water. The etched wafer was then dried and flood exposed at 200 $mJ/cm^2$. Photoresist was removed by putting the wafer in an $Me_4NOH$ solution for 2 minutes. The wafer with a patterned BCB film was rinsed with water and cured.

Example 11

Use of DVS-bisBCB/BCB Acrylic Acid (mole ratio 30:70) (*about 341 g/mole of acid functionality*) in an Aqueous Base Developable Negtive Tone Photoimaging System DVS-bisBCB (28.0 grams, 0.072 mole), BCB acrylic acid (29.1 grams, 0.167 mole) and 172 grams mestilyene were heated at 160° C. for 174 hours. DVS-bisBCB to BCB acrylic acid was 30/70 and percentage of solids was 25. Some solvent escaped during B-staging and the solution concentration was 39% with viscosity at 128 Centipoise. Some mesitylene was removed to generate a solution with 49% solids.

The B-staged solution (1.76 grams, 0.862 g prepolymer) and 1,6-bis(4-azidobenzylydene)-4-ethylcyclohexanone (41.7 mg, 4.6%) were mixed. Cyclohexanone (0.12 grams) was added to generate a homogeneous solution. The solution was spin-coated on a 4 inch wafer at 1500 rpm. Prebake time at 95° C. was 110 seconds. The wafer was exposed at 300 $mJ/cm^2$ with a mask. Development was performed in a 1.4% TMAH solution for 2 minutes and 13 seconds. The wafer was baked at 75° C. for 1.5 hours and then cured. Patterned film thickness was 2.5 microns.

What is claimed is:

1. A curable polymer comprising the partially polymerized product of at least one cyclobutarene monomer wherein the product comprises a pendant group comprising a —COOH moiety in amounts defined by equivalent weights in the range of about 200 to about 330 g/mole of —COOH moiety.

2. The polymer of claim 1 wherein the equivalent weight is in the range of about 220 to about 300 g/mole of acid functionality.

3. The polymer of claim 1 wherein the equivalent weight is in the range of about 230 to about 270 g/mole of acid functionality.

4. The polymer of claim 1 wherein the polymerization occurs in a solvent selected from di(propylene glycol) methyl ether acetate isomers; toluene; xylene; mesitylene; alcohols having from 3 to 6 carbon atoms; methylcyclohexanone; N-methylpyrrolidinone; butyrolactone; and dipropylene glycol dimethyl ether isomers.

5. The polymer of claim 1 having a molecular weight in the range of 1000 to about 50,000 grams/mol.

6. The polymer of claim 1 having a molecular weight in the range of 1500 to about 25,000 grams/mol.

7. The polymer of claim 1 having a molecular weight in the range of 2000 to about 15,000 grams/mol.

8. A photoreactive polymeric composition comprising the polymer of claim 1 and a photoactive composition such that the polymeric composition is rendered either soluble or insoluble upon exposure to activating wavelengths of radiation.

9. The polymeric composition of claim 8 wherein the photoactive composition comprises a dissolution inhibitor such that the polymeric composition is rendered soluble upon exposure to activating radiation.

10. The composition of claim 9 wherein the photoactive composition comprises a compound selected from sulfonyl esters of trihydroxybenzophenone and cumyl phenol.

11. The composition of claim 8 wherein the photoactive composition comprises a photo-initiator that initiates further cure of the polymer upon exposure to activating radiation.

12. The composition of claim 8 wherein the polymer or oligomer is the partially polymerized product of monomers comprising (a) a cyclobutarene monomer having the formula:

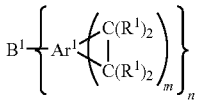

where $B^1$ is an n-valent organic linking group, $Ar^1$ is a polyvalent aromatic or heteroaromatic group and the carbon atoms of the cyclobutane ring are bonded to adjacent carbon atoms on the same aromatic ring of $Ar^1$;

m is an integer of 1 or more;

n is an integer of 1 or more; and $R^1$ is a monovalent group; and (b) is a cyclobutarene monomer comprising a —COOH moiety.

13. The polymer of claim 1, which is the partially polymerized product of monomers comprising:

(a) a cyclobutarene monomer having the formula:

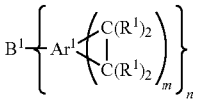

wherein $B^1$ is an n-valent organic linking group;

$Ar^1$ is a polyvalent aromatic or heteroaromatic group and the carbon atoms of the cyclobutane ring are bonded to adjacent carbon atoms on the same aromatic ring of $Ar^1$;

m is an integer of 1 or more;

n is an integer of 1 or more; and $R^1$ is a monovalent group; and (b) a cyclobutarene monomer comprising a —COOH moiety.

14. The polymer of claim 13 wherein monomer (a) has the following formula:

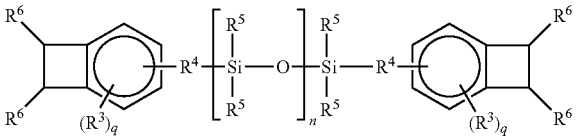

wherein each $R^3$ is independently an alkyl group of 1–6 carbon atoms, trimethylsilyl, methoxy or chloro; each $R^4$ is independently a divalent, ethylenically unsaturated organic group; each $R^5$ is independently hydrogen, an alkyl group of 1 to 6 carbon atoms, cycloalkyl, aralkyl or phenyl; each $R^6$ is independently hydrogen, an alkyl group of 1 to 6 carbon atoms, chloro or cyano; n is an integer of 1 or more; and each q is an integer of 0 to 3.

15. The polymer of claim 14 wherein the $r^4$is —$CH_2$=$CH_2$—, $R^5$ is methyl, $R^6$ is hydrogen, n is 1 and q is 0.

16. The polymer of claim 13 wherein the monomer (b) has the following formula:

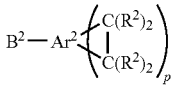

wherein $B^2$ is a monovalent organic group comprising a —COOH moiety;

$Ar^2$ is a polyvalent aromatic or heteroaromatic group and the carbon atoms of the cyclobutane ring are bonded to adjacent carbon atoms on the same aromatic ring of $Ar^2$;

p is an integer of 1 or more; and $R^2$ is a monovalent group.

17. The polymer of claim 13 wherein monomer (b) has the formula:

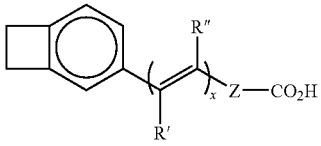

wherein

R' and R" are independently selected from hydrogen, alkyl groups of 1 to 6 carbon atoms, aryl groups, or R' and R" taken together from a cyclic group of 4 to 8 carbon atoms;

Z is a carbon-to-carbon bond or an aryl group; and x is an integer from 0 to 3.

18. The polymer of claim 1, which is the partially polymerized product of monomers comprising:

(a) a cyclobutarene monomer having the formula:

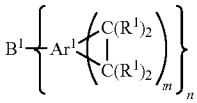

wherein $B^1$ is an n-valent organic linking group;

$Ar^1$ is a polyvalent aromatic or heteroaromatic group and the carbon atoms of the cyclobutane ring are bonded to adjacent carbon atoms on the same aromatic ring of $Ar^1$;

m is an integer of 1 or more;

n is an integer of 1 or more; and $R^1$ is a monovalent group; and (b') is a cyclobutarene monomer having a pendant group, which at least partially converts to a carboxylic acid moiety during the polymerization process or by hydrolysis.

19. The polymer of claim 18 wherein (b') has the formula

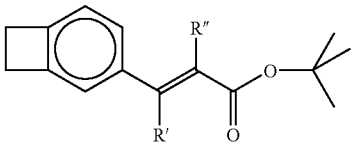

where R' and R" are independently selected from hydrogen, alkyl groups of 1 to 6 carbon atoms, aryl groups, or R' and R" taken together from a cyclic group of 4 to 8 carbon atoms.

20. A process for making the polymer of claim 1 comprising the steps of:

(1) combining, in a solvent selected from di(propylene glycol) methyl ether acetate isomers; toluene; xylene; mesitylene; alcohols having from 3 to 6 carbon atoms; methylcyclohexanone; N-methylpyrrolidonone; butyrolactone; and dipropylene glycol dimethyl ether isomers, a monomer (a) having the formula

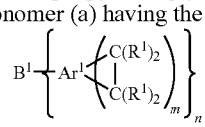

wherein $B^1$ is an n-valent organic linking group, $Ar^1$ is a polyvalent aromatic or heteroaromatic group and the carbon atoms of the cyclobutane ring are bonded to adjacent carbon atoms on the same aromatic ring of $Ar^1$;

m is an integer of 1 or more;

n is an integer of 1 or more;

with a monomer selected from monomer (b), which is a cyclobutarene monomer comprising a carboxylic acid moiety and the monomer (b'), which is a cyclobutarene monomer having a pendant group, which at least partially converts to a carboxylic acid moiety during the polymerizatipn process; and (2) heating the combination to react with the monomers.

21. A partially polymerized product of monomers comprising a cyclobutarene monomer (a) having the formula:

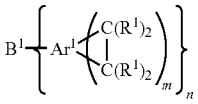

wherein $B^1$ is an n-valent organic linking group;

$Ar^1$ is a polyvalent aromatic or heteroaromatic group and the carbon atoms of the cyclobutane ring are bonded to adjacent carbon atoms on the same aromatic ring of $Ar^1$;

m is an integer of 1 or more;

n is an integer of 1 or more; and $R^1$ is a monovalent group; and (b') is a cyclobutarene monomer having a pendant group, which at least partially converts to a carboxylic acid during the polymerization process.

22. A curable polymer comprising the partially polymerized product of (a) a monomer of the formula:

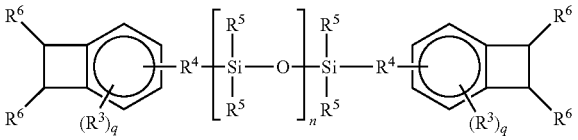

wherein each $R^3$ is independently an alkyl group of 1–6 carbon atoms, trimethylsilyl, methoxy or chloro;

each $R^4$ is independently a divalent, ethylenically unsaturated organic each $R^5$ is independently hydrogen, an alkyl group of 1 to 6 carbon atoms, cycloalkyl, aralkyl or phenyl;

each $R^6$ is independently hydrogen, an alkyl group of 1 to 6 carbon atoms, chloro or cyano;

n is an integer of 1 or more; and each q is an integer of 0 to 3; and (b) is a monomer of one of the following formulas:

(i)

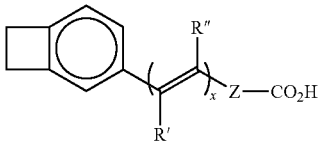

(ii)

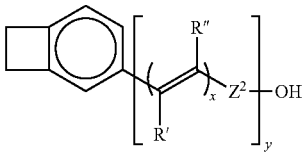

and (iii)

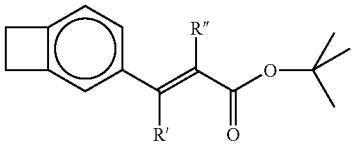

wherein

R' and R" are independently selected from hydrogen, alkyl groups of 1 to 6 carbon atoms, aryl groups, or R' and R" taken together from a cyclic group of 4 to 8 carbon atoms;

Z is a carbon-to-carbon bond or an aryl group;

x is an integer from 0 to 3;

y is 0 or 1; and $Z^2$ is an aryl group.

*23. A curable polymer comprising the partially polymerized product of at least one cyclobutarene monomer wherein the product comprises acid functionality in amounts defined by equivalent weights in the range of about 200 to about 434 g/mole of acid functionality.*

*24. A curable polymer comprising the partially polymerized product of at least one cyclobutarene monomer wherein the product comprises acid functionality in amounts defined by equivalent weights in the range of about 200 to about 564 g/mole of acid functionality.*

* * * * *